US 6,576,941 B1

United States Patent
Lee et al.

(10) Patent No.: US 6,576,941 B1
(45) Date of Patent: Jun. 10, 2003

(54) FERROELECTRIC CAPACITORS ON PROTRUDING PORTIONS OF CONDUCTIVE PLUGS HAVING A SMALLER CROSS-SECTIONAL SIZE THAN BASE PORTIONS THEREOF

(75) Inventors: Moon-Sook Lee, Seoul (KR); Kun-Sang Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/079,160

(22) Filed: Feb. 20, 2002

(51) Int. Cl.⁷ ............................................. H01L 31/119
(52) U.S. Cl. ...................... 257/295; 257/295; 257/306
(58) Field of Search ........................... 257/295, 760, 257/303, 306; 438/618, 240, 694, 3

(56) References Cited

U.S. PATENT DOCUMENTS

| 5,499,207 A | | 3/1996 | Miki et al. | |
|---|---|---|---|---|
| 5,581,436 A | | 12/1996 | Summerfelt et al. | |
| 5,976,928 A | * | 11/1999 | Kirlin et al. | 438/240 |
| 6,043,526 A | * | 3/2000 | Ochiai | 257/295 |
| 6,051,882 A | * | 4/2000 | Avanzino et al. | 257/760 |
| 6,090,697 A | * | 7/2000 | Xing et al. | 438/618 |
| 6,177,351 B1 | * | 1/2001 | Beratan et al. | 438/694 |
| 6,291,251 B1 | * | 9/2001 | Nam | 438/3 |
| 6,384,443 B1 | * | 5/2002 | Tsunemine | 257/303 |

OTHER PUBLICATIONS

Mizutani et al. (U.S. patent application No.: US 2002/0014648A1).*

* cited by examiner

Primary Examiner—David Nelms
Assistant Examiner—Thinh T. Nguyen
(74) Attorney, Agent, or Firm—Myers Bigel Sibley & Sajovec (57) ABSTRACT

Ferroelectric capacitors, etc. are disclosed that include a conductive plug that has a base portion of a first cross-sectional width and a protruding portion that protrudes from the base portion and has a second cross-sectional width that is less than the first cross-sectional width. A conductive layer of the ferroelectric capacitor is on the protruding portion opposite the base portion. Related methods are also disclosed.

24 Claims, 9 Drawing Sheets

(Prior Art)

FIGURE 1

(Prior Art)

FIGURE 2

(Prior Art)

FIGURE 9

FERROELECTRIC CAPACITORS ON PROTRUDING PORTIONS OF CONDUCTIVE PLUGS HAVING A SMALLER CROSS-SECTIONAL SIZE THAN BASE PORTIONS THEREOF

FIELD OF THE INVENTION

This invention relates to the field of capacitors in general, and more particularly, to the field of ferroelectric capacitors and methods of forming same.

BACKGROUND OF THE INVENTION

Ferroelectric memory devices can have nonvolatile characteristics such that the device retains data even when power is not supplied to the device. Like other memory devices, such as DRAMs and SRAMs, ferroelectric memory devices may operate at low voltages. Accordingly, ferroelectric memory devices can be used in devices commonly referred to as "smart cards" or the like.

Typical methods of fabricating ferroelectric capacitors in ferroelectric memory devices can include forming a thick lower conductive layer on a semiconductor substrate and patterning the lower conductive layer to form a lower electrode of the capacitor. A ferroelectric material can be formed on the lower electrode using, for example, a sol-gel, Chemical Vapor Deposition (CVD) or sputtering technique. The ferroelectric layer can then be patterned.

An upper conductive layer can be formed on the patterned ferroelectric layer. The upper conductive layer can also be patterned to provide an upper electrode for the ferroelectric capacitor. As a result, conventional ferroelectric capacitors can exhibit planar-type structures. The lower and upper conductive layers are typically formed using a Noble metal such as iridium or platinum. The lower conductive layer can also include a Noble metal oxide material.

In some conventional planar-type ferroelectric capacitors, the thickness of the lower electrode is used to provide increased surface area which can increase the capacitance thereof. However, it may be difficult to pattern the thick lower conductive layer due to limitations in etching the Noble metal used. Also, the additional photolithography steps used to form the lower electrode can cause the upper electrode to be misaligned to the underlying conductive material used to form the lower electrode.

It is known to fabricate cylindrically shaped bottom electrodes to increase the surface area of the bottom electrode without using an etching process. In some conventional processes, an insulating layer is formed on a semiconductor substrate and is patterned to form an opening therein that exposes a portion of the substrate. A Noble metal layer can be conformally deposited over the resultant structure and in the opening. A sacrificial insulating layer can be formed thereon including in the opening. The Noble metal layer is planarized using a Chemical-Mechanical Polishing (CMP) technique until the surface of the sacrificial insulating layer is exposed, thereby forming a U-shaped bottom electrode in the opening. The CMP technique is used to electrically separate adjacent U-shaped bottom electrodes.

However, there may also be limitations of the CMP technique in patterning the Noble metal layer in that misalignment to an underlying conductive material may occur because an additional photolithography step is used to form the U-shaped bottom electrode.

Figure 1:
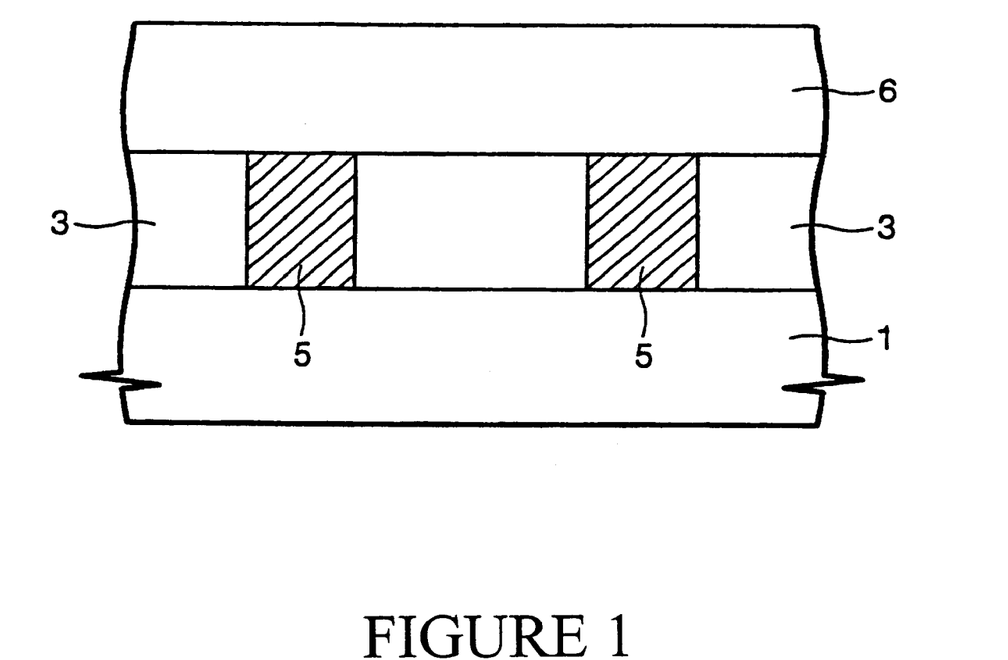
FIGS. 1–3 are cross-sectional views that illustrate conventional ferroelectric capacitors and methods of forming such conventional ferroelectric capacitors.

FIG. 1 illustrates a cross-sectional view of a lower plug formed using conventional methods. Referring to FIG. 1, a lower insulating layer 3 is formed on a semiconductor substrate 1. The lower insulating layer 3 is patterned using conventional photolithography to form contact recesses that expose the substrate 1. Each of the contact recesses is filled with a first contact plug 5. A sacrificial insulating layer 6 is formed on the surface of the lower insulating layer 3 including the first contact plugs 5.

Figure 2:
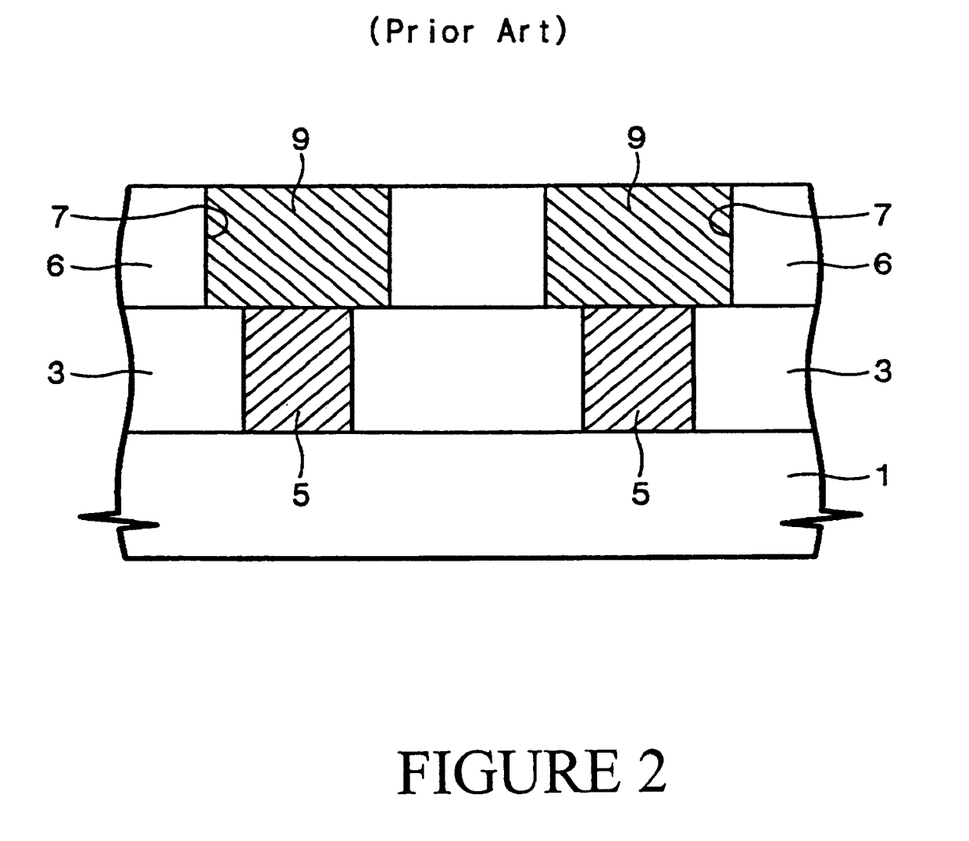

FIG. 2 illustrates a cross-sectional view of an upper plug formed using conventional methods. Referring to FIG. 2, in subsequent steps, the sacrificial insulating layer 6 is patterned, using conventional photolithography, to form openings 7 that expose the first contact plugs 5. The widths of the openings 7 are greater than the widths of the first contact plugs 5 to reduce misalignment between the first contact plugs 5 and the openings 7. Each of the openings 7 is filled with a second contact plug 9 which can be the same or similar to the conductive material used to form the first contact plugs 5. Accordingly, the first and second plugs are formed in separate steps. As a result, the widths of the second contact plugs 9 are larger than that of the first contact plugs 5. Unfortunately, this type of 2-step photolithography can be complicated to implement and may contribute to misalignment of the first and second plugs.

Figure 3:
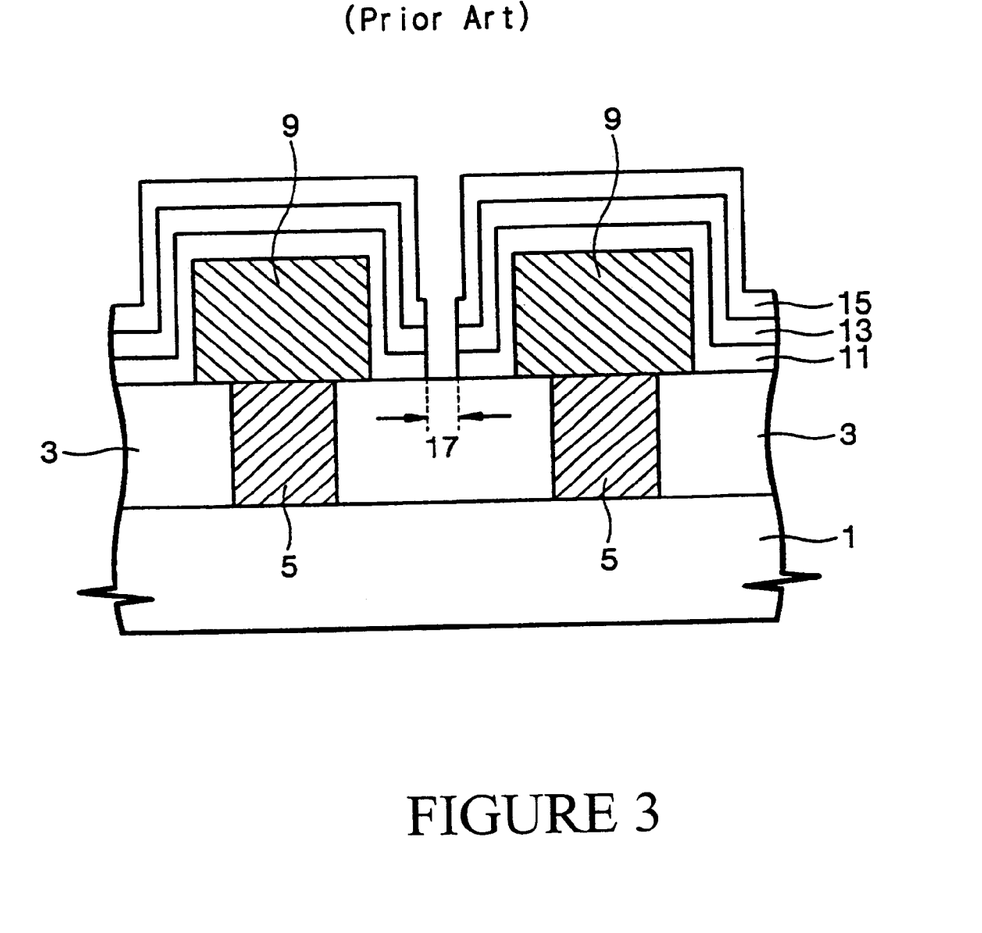

FIG. 3 illustrates a cross-sectional view of a ferroelectric capacitor formed on the upper and lower plugs formed using conventional methods. Referring to FIG. 3, the sacrificial insulating layer 6 is selectively removed to expose the side walls of the second contact plug 9 which increases the exposed surface area of the second contact plug 9. A first Noble metal layer 11, a ferroelectric layer 13, and a second Noble metal layer 15 are sequentially formed on the entire surface of the resultant structure where the sacrificial insulating layer 6 was removed. The second Noble metal layer 15, the ferroelectric layer 13, and the first Noble metal layer 11 are sequentially patterned to form a plurality of ferroelectric capacitors, which are spaced-apart from one another on the substrate 1.

Unfortunately, as the cross-sectional width of the second contact plug 9 increases, it may be difficult to completely separate adjacent ferroelectric capacitors from one another since the spacing 17 that separates adjacent ferroelectric capacitors is reduced as a result of the increased width of the second contact plug 9. Furthermore, the difficulty in separating the adjacent ferroelectric capacitors can be worsened because it may be difficult to pattern electrodes made from Noble metals.

SUMMARY OF THE INVENTION

Embodiments according to the invention can provide ferroelectric capacitors and methods of forming ferroelectric capacitors that include a conductive plug that has a base portion of a first cross-sectional width and a protruding portion that protrudes from the base portion and has a second cross-sectional width that is less than the first cross-sectional width. A conductive layer of the ferroelectric capacitor is on the protruding portion opposite the base portion. Accordingly, the protruding portion having the smaller cross-sectional size can allow the surface area of a lower electrode of the ferroelectric capacitor to be increased while maintaining the distance that separates adjacent ferroelectric capacitors, thereby allowing adjacent ferroelectric capacitors to be more easily separated from one another. Furthermore, the base and protruding portions can be formed using one photolithography step. Thus, an alignment margin can be increased.

In some embodiments according to the invention, a ferroelectric material is on the first conductive layer opposite the protruding portion of the conductive plug and a second conductive layer is on the ferroelectric material opposite the first conductive layer. In some embodiments according to the invention, the base and protruding portions of the conductive plug may be a unitary structure.

In some embodiments according to the invention, the base portion of the conductive plug includes a first side wall and the protruding portion of the conductive plug includes a second side wall that is on the base portion and that is offset from the first side wall to define a shoulder of the base portion of the conductive plug wherein the conductive layer is on the shoulder.

DETAILED DESCRIPTION OF EMBODIMENTS ACCORDING TO THE INVENTION

The invention now will be described more fully hereinafter with reference to the accompanying drawings, in which embodiments of the invention are illustrated. The invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the relative sizes of regions may be exaggerated for clarity. It will be understood that when an element such as a layer, region, portion, or substrate is referred to as being "on" another element, it can be directly on the other element or intervening elements may also be present. In contrast, when an element is referred to as being "directly on" another element, there are no intervening elements present. It will be understood that when an element such as a layer, region, portion, or substrate is referred to as being on an intervening element and "opposite" another element, the element is separated from the other element by the intervening element.

It will be understood that the ferroelectric capacitors disclosed herein can be used to provide ferroelectric memory devices including a plurality of the ferroelectric capacitors according to the invention. The terms used herein are to be given their ordinary meaning unless explicitly defined otherwise herein.

Embodiments according to the invention can provide ferroelectric capacitors, etc. that include a conductive plug that has a base portion of a first cross-sectional width and a protruding portion that protrudes from the base portion and has a second cross-sectional width that is less than the first cross-sectional width. A conductive layer of the ferroelectric capacitor is on the protruding portion opposite the base portion. Accordingly, the protruding portion having the smaller cross-sectional size can allow the surface area of a lower electrode of the ferroelectric capacitor to be increased while maintaining the distance that separates adjacent ferroelectric capacitors, thereby allowing the base and protruding portions to be more easily aligned and allowing adjacent ferroelectric capacitors to be more easily separated from one another.

Embodiments according to the invention will now be described with reference to FIGS. 4–9 which illustrate the fabrication of ferroelectric memory devices including ferroelectric capacitors according to embodiments of the invention. While described with reference to memory devices, the invention is not limited only to use in such devices.

Figure 4:
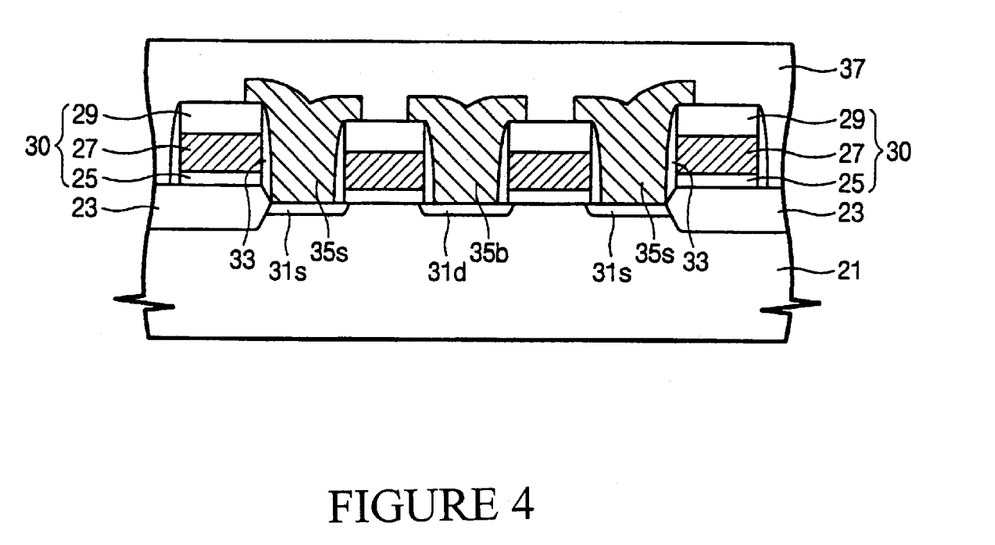
FIGS. 4–9 are cross-sectional views that illustrate embodiments of ferroelectric capacitors and methods of forming such ferroelectric capacitors according to the invention.

Referring to FIG. 4, an isolation layer 23 is formed in a region of an integrated circuit substrate 21, such as a semiconductor substrate, to define active regions therein. A gate insulating layer, a gate conductive layer and a gate capping layer are formed in the region of the substrate 21 including the isolation layer 23. The gate capping layer, the gate conductive layer and the gate insulating layer are patterned to form a plurality of spaced-apart gate structures 30. As a result, each of the gate structures 30 includes a gate insulating layer 25, a gate electrode 27 that can provide a word line, and a capping layer 29, which are stacked as shown in FIG. 4.

Source/drain regions 31$s$ and 31$d$, spacers 33, storage node pads 35$s$ and bit line pads 35$b$ may be formed using conventional methods. In some embodiments according to the invention, the pads 35$s$ and 35$b$ may not be formed. A first interlayer insulating layer 37 is formed on the entire surface of the resultant structure including the pads 35$s$ and 35$b$ (if formed).

Figure 5:
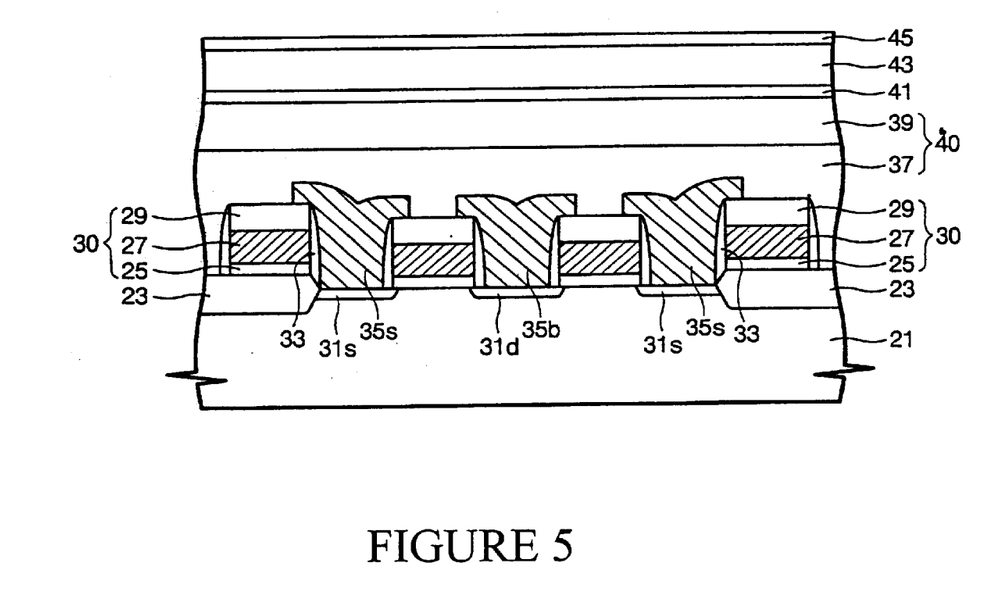

Referring to FIG. 5, a second interlayer insulating layer 39, an etch stop layer 41, a sacrificial insulating layer 43 and a stop layer 45, such as a CMP stop layer, are formed on the first interlayer insulating layer 37. In some embodiments according to the invention, bit lines (not shown), which are electrically connected to the respective pads 35$b$, may be formed on the first interlayer insulating layer 37 prior to formation of the second interlayer insulating layer 39 to provide a capacitor over bit line structure. In some embodiments according to the invention, the second interlayer insulating layer 39 is formed of the same material as the first interlayer insulating layer 37. The first and second interlayer insulating layers 37 and 39 constitute a lower insulating layer 40.

In some embodiments according to the invention, the sacrificial insulating layer 43 is formed of an insulating layer having an etch rate that is less than the lower insulating layer 40. In some embodiments according to the invention, the lower insulating layer 40 is formed of a Flowable OXide (FOX) layer, a BoroPhosphoSilicate Glass (BPSG) layer, a Spin On Glass (SOG) layer or an Undoped Silicate Glass (USG) layer, whereas the sacrificial insulating layer 43 is formed of a High Density Plasma (HDP) oxide layer or a TetraEthylOrthoSilicate (TEOS) oxide layer. In some embodiments according to the invention, the etch stop layer 41 is formed of a silicon nitride (SiN) layer, a silicon oxinitride (SiON) layer, or a titanium oxide (TiO$_x$). The etch stop layer 41 can also act as an adhesion layer between at least the lower insulating layer 40 and a subsequently formed lower electrode. The etch stop layer 41, which can be subsequently removed, can be a titanium nitride (TiN) layer.

If the etch stop layer 41 is formed of a conductive material (such as TiN) which is later removed, an additional etch stop layer can be formed on the lower insulating layer 40 (and on a protruding portion of a subsequently formed plug) to provide an adhesion layer between the lower insulating layer 40 and a lower electrode of the ferroelectric capacitor.

In some embodiments according to the invention, the stop layer 45 can be a silicon nitride (SiN) layer, a silicon oxinitride (SiON) layer, a titanium oxide (TiO$_x$) layer or a titanium nitride (TiN) layer. The formation of the etch stop layer 41 and the stop layer 45 may be omitted.

Figure 6:
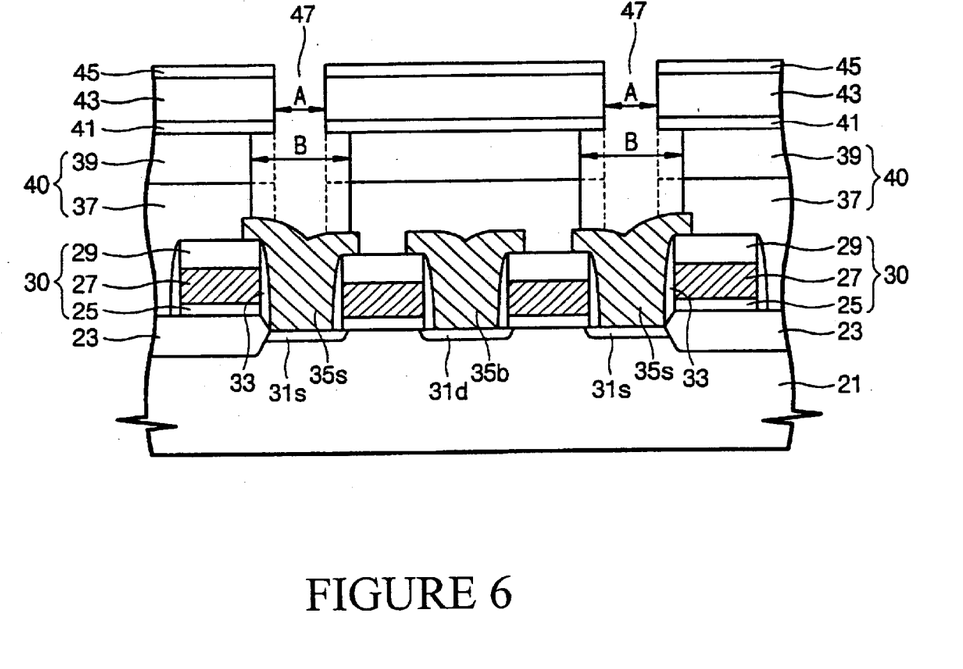

Referring to FIG. 6, portions of the stop layer 45, the sacrificial insulating layer 43, the etch stop layer 41, and the lower insulating layer 40 are removed, using a single photolithography step, to form contact recesses 47 that expose the storage node pads 35s. The contact recesses 47 have a substantially vertical side wall profile and a first cross-sectional width "A." The contact recesses 47 may be formed by either wet or dry etching.

The lower insulating layer 40 is isotropically etched to further increase the cross-sectional width of the portion of the contact recess 47 defined by the side wall shown by the dashed lines in FIG. 6, to a second cross-sectional width "B." Thus, the upper portion of the contact recesses 47 has the first cross-sectional width A which is less than the second cross-sectional width B of the lower portion of the contact recesses 47. In some embodiments according to the invention, the isotropic etching of the lower insulating layer 40 is performed using a wet etching technique. Although the cross-sectional width of the lower portion of the contact recess 47 is increased by the isotropic etching, a further increase in the cross-sectional width A of the upper portion of the contact recesses 47 is avoided by, for example, forming the lower insulating layer 40 from a material which etches quickly compared to a rate at which the sacrificial insulating layer 43 is etched. In some embodiments according to the invention, the side walls that define the upper and lower portions of the contact recesses 47 are offset from one another due to the difference in the first and second cross-sectional widths A, B.

The stop layer 45 can act as an etching mask through which the storage node contact recesses 47 are formed. In some embodiments according to the invention, as an alternative to the stop layer 45, a photoresist pattern used to form the pattern for the contact recesses may act as the etch mask through which the storage node contact recesses 47 are formed.

Figure 7:
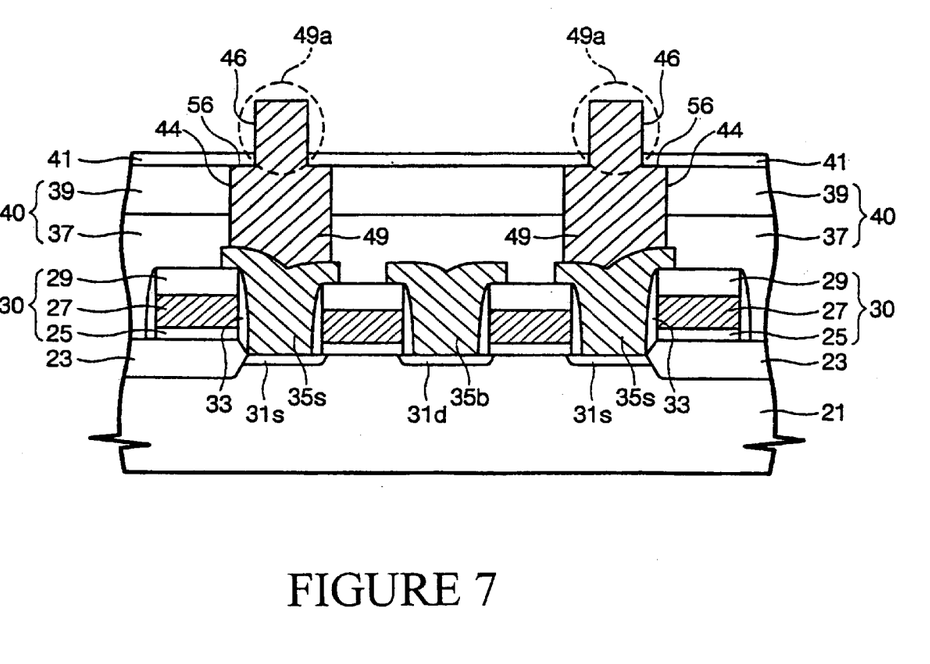

Referring to FIG. 7, contact plugs 49 are formed in the respective storage node contact recesses 47 using methods known to those having skill in the art, such as a CMP technique. Other techniques can be used. The contact plug 49 has a base portion with the cross-sectional width B that is defined by a first side wall 44. The contact plug 49 also includes a protruding portion 49a that is on the base portion and protrudes therefrom. The protruding portion 49a has cross-sectional width A that is less than the cross-sectional width B of the base portion and has a second side wall 46 that is offset from the first side wall 44. The offset between the first and second side walls 44, 46 defines a shoulder 56 of the base portion. The stop layer 45 and the sacrificial insulating layer 43 are removed to expose the second side wall 46 of the protruding portion 49a. The shoulder 56 remains under the etch stop layer 41.

In some embodiments according to the invention, the contact plugs 49 are formed of tungsten, polysilicon, titanium nitride, titanium, titanium silicide, cobalt silicide or combinations thereof. For example, the contact plugs 49 may comprise a Ti/TiN/W structure, a Ti/TiN/poly-Si structure, a (TiSi$_x$ or CoSi$_x$)/(Ti or TiN)/(W or poly-Si) structure, or the like. In some embodiments according to the invention, the contact plugs 49 can be formed by sputtering, CVD or ALD(Atomic Layer Deposition) or other methods to be unitary structures. For example, in some embodiments according to the invention, the base portions and the protruding portions are formed using a single step.

Figure 8:
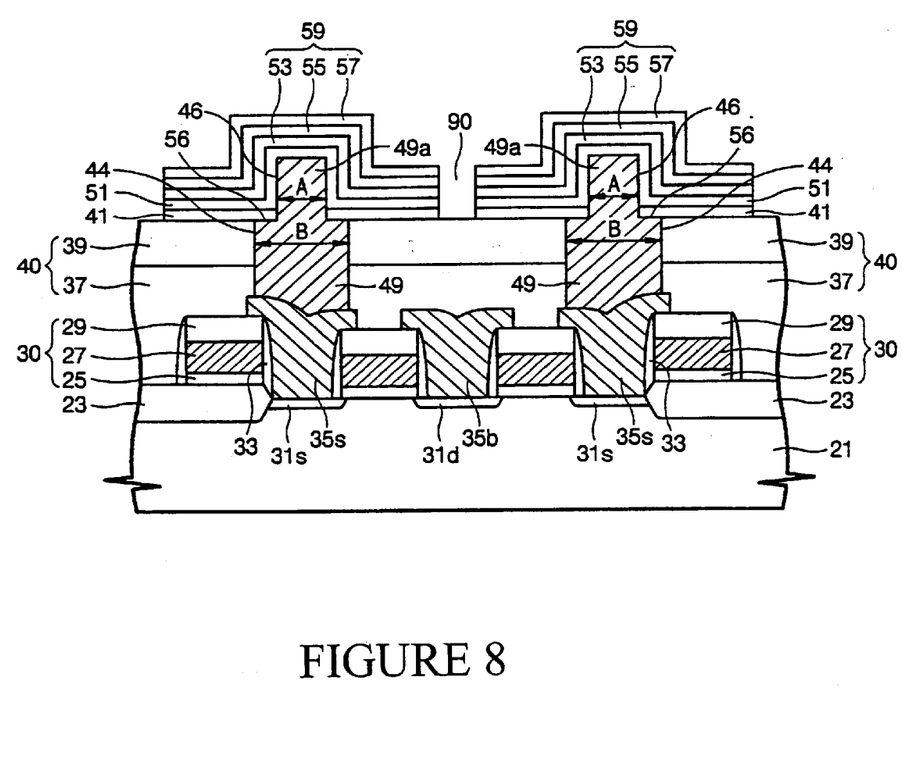

Referring to FIG. 8, a first conductive layer 53, a ferroelectric layer 55 and a second conductive layer 57 of a ferroelectric capacitor are sequentially formed on the resultant structure shown in FIG. 7 (where the CMP stop layer 45 and the sacrificial insulating layer 43 were removed). It will be understood that the first and second conductive layers 53, 57 define lower and upper electrode layers of the ferroelectric capacitor. In some embodiments according to the invention, the etch stop layer 41 (or adhesion layer) is removed. In some embodiments according to the invention, an oxidation barrier layer 51 is formed prior to the formation of the lower electrode layer 53.

In some embodiments according to the invention, the oxidation barrier layer 51 is formed from a conductive material, such as iridium, ruthenium, iridium oxide, ruthenium oxide, or combinations thereof. In some embodiments according to the invention, the lower and upper electrode layers are formed of a Noble metal layer such as platinum, ruthenium, iridium, rhodium, osmium, palladium, or an oxide thereof or of a combination of a Noble metal and an oxide thereof. Other materials can be used. In some embodiments according to the invention, the ferroelectric layer is formed of SrTiO$_3$, BaTiO$_3$, BST, PZT, SBT (SrBi$_2$Ta$_2$O$_9$), PLZT ((Pb,La)(Zr,Ti)O$_3$), ((Pb,Ca)(Zr,Ti)O$_3$), Bi$_4$Ti$_3$O$_{12}$, BLT, BiLaTiO$_3$ or combinations thereof. Other materials can be used to form the ferroelectric layer 55.

In some embodiments according to the invention, the upper electrode layer 57, the ferroelectric layer 55, the lower electrode layer 53, the oxidation barrier layer 51 and the etch stop layer 41 are patterned to form a plurality of ferroelectric capacitors 59 that are separated by a gap 90 on the lower insulating layer 40, resulting in each of the ferroelectric capacitors 59 having a separate lower electrode layer 53, a separate ferroelectric layer 55 and a separate upper electrode layer 57, which are stacked as shown in FIG. 8. In embodiments according to the invention where the etch stop layer 41 is a conductive material, such as TiN, the etch stop layer 41 is patterned and removed from the substrate between adjacent ferroelectric capacitors to avoid causing an electrical short between the adjacent ferroelectric capacitors. In some embodiments according to the invention where the etch stop layer 41 is not conductive, the etch stop layer 41 is not patterned and, therefore, remains on the lower insulating layer 40. In some embodiments according to the invention, an oxidation barrier layer pattern 51 is formed between the lower electrode 53 and the protruding portion 49a.

Figure 9:
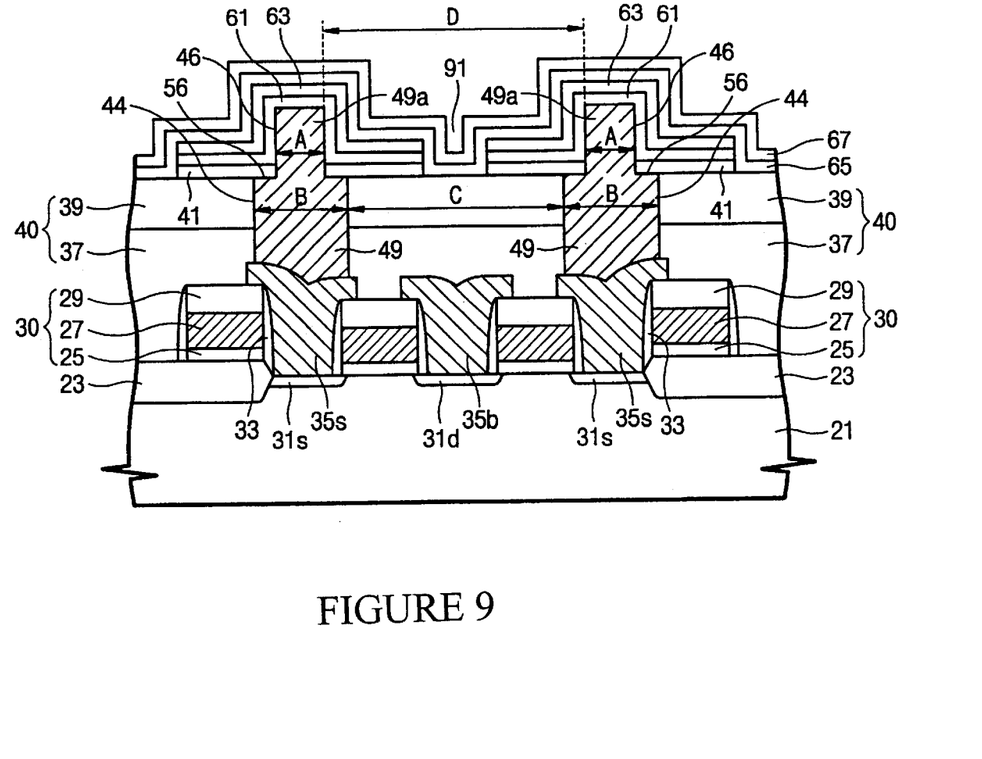

FIG. 9 is a cross-sectional view illustrating other embodiments of ferroelectric memory devices including ferroelectric capacitors according to the invention. Referring to FIG. 9, the contact plugs 49 can be formed using the same method as those described in reference to FIGS. 4 to 7. In the present embodiment according to the invention, the CMP stop layer 45 and the sacrificial insulating layer 43 are removed as described in FIG. 7. If the etch stop layer 41 is formed of a conductive material (such as TiN) which is removed, an additional etch stop layer can be formed on the lower insulating layer 40 (and on the protruding portion 49a of the plug) to provide an adhesion layer between the lower insulating layer 40 and a lower electrode of the ferroelectric capacitor.

A lower electrode layer 63 is formed on the structure where the stop layer 45 and the sacrificial insulating layer 43 were removed. In some embodiments according to the invention, an oxidation barrier layer 61 is formed on the etch stop layer 41 prior to the lower electrode layer 63 being formed. The lower electrode layer 63, the oxidation barrier layer 61 and the etch stop layer 41 are patterned to form a plurality of lower electrodes of the ferroelectric capacitors on the protruding portions of the respective contact plugs 49 in the ferroelectric memory devices. The patterning can define a gap 91 in the conductive lower electrodes, the oxidation barrier layer 61, and the etch stop layer 41 on the lower insulating layer 40 between the plurality of lower electrodes so as to avoid an electrical short between adjacent ferroelectric capacitors. In some embodiments according to the invention, the etch stop layer 41 is not patterned.

A ferroelectric layer 65 and an upper electrode layer 67 are formed on the lower electrodes 63 and in the gap 91. The upper electrode layer 67 and the ferroelectric layer 65 are patterned to form a plurality of ferroelectric layer patterns and a plurality of upper electrodes on each one of the lower electrodes 63 or at least on two adjacent lower electrodes 63. The oxidation barrier layer 61, the lower electrode layer 63, the ferroelectric layer 65 and the upper electrode layer 67 can be formed as discussed above in reference to FIGS. 4–8.

Each of the contact plugs 49 have respective base portions with cross-sectional widths B that are defined by the first side wall 44. The contact plugs 49 also include respective protruding portions 49a that are on the base portions and protrude therefrom. The protruding portions 49a have cross-sectional widths A that are less than the cross-sectional widths B and that are defined by respective second side walls 46 that are offset from the respective first side walls 44. The first side walls 44 are adjacent to one another and are spaced apart by a distance "C." The second side walls 46 are adjacent to one another and are spaced apart by a distance "D" which is greater than the distance C.

It should be noted that many variations and modifications can be made to the embodiments described above without substantially departing from the principles of the present invention. All such variations and modifications are intended to be included herein within the scope of the present invention, as set forth in the following claims.

What is claimed:

1. A ferroelectric capacitor comprising:
   a conductive plug having a base portion of a first cross-sectional width and a protruding portion that protrudes from the base portion having a second cross-sectional width that is less than the first cross-sectional width, wherein the base and protruding portions of the conductive plug comprise a unitary structure; and
   a conductive layer of the ferroelectric capacitor on the protruding portion opposite the base portion.

2. A ferroelectric capacitor according to claim 1 wherein the conductive layer comprises a first conductive layer, wherein the ferroelectric capacitor further comprises:
   a ferroelectric material on the first conductive layer opposite the protruding portion of the conductive plug; and
   a second conductive layer on the ferroelectric material opposite the first conductive layer.

3. A ferroelectric capacitor according to claim 1 wherein the base portion of the conductive plug includes a first side wall and the protruding portion of the conductive plug includes a second side wall that is on the base portion and that is offset from the first side wall to define a shoulder of the base portion of the conductive plug, wherein the conductive layer is on the shoulder.

4. A ferroelectric capacitor comprising:
   a first portion of a conductive plug having a first cross-sectional width;
   a second portion of the conductive plug, on the first portion, having a second cross-sectional width that is less than the first width, wherein the first and second portions of the conductive plug comprise a unitary structure; and
   a conductive layer of the ferroelectric capacitor on the second portion opposite the first portion.

5. A ferroelectric capacitor according to claim 2 wherein the first conductive layer is formed on a top and the side wall surfaces of the protruding portion of the conductive plug.

6. A ferroelectric capacitor according to claim 4 wherein the conductive layer comprises a first conductive layer, wherein the ferroelectric capacitor further comprises:
   a ferroelectric material on the first conductive layer opposite the second portion of the conductive plug; and
   a second conductive layer on the ferroelectric material opposite the first conductive layer.

7. A ferroelectric capacitor according to claim 4 wherein the first portion of the conductive plug includes a first side wall and the second portion of the conductive plug includes a second side wall that is on the first portion and that is offset from the first side wall to define a shoulder of the first portion of the conductive plug, wherein the conductive layer is on the shoulder.

8. A ferroelectric capacitor according to claim 7 further comprising:
   an etch stop layer between the shoulder and the conductive layer.

9. A ferroelectric capacitor according to claim 4 wherein the first portion of the conductive plug includes a first side wall and the second portion of the conductive plug includes a second side wall that is on the first portion and that is offset from the first side wall, wherein the first and second side walls have a substantially vertical profiles.

10. A ferroelectric capacitor according to claim 4 wherein the conductive layer comprises a Noble metal, an oxide of a Noble metal, or combinations thereof.

11. A ferroelectric capacitor according to claim 4 wherein the conductive layer comprises platinum, an oxide of platinum, ruthenium, an oxide of ruthenium, iridium, an oxide of iridium, rhodium, an oxide of rhodium, osmium, an oxide of osmium, palladium, an oxide of palladium, or combinations thereof.

12. A ferroelectric capacitor according to claim 6 wherein the ferroelectric material comprises $SrTiO_3$, $BaTiO_3$, BST, PZT, $SrBi_2TaO_9$, $((Pb, La)(Zr,Ti)O_3)$, $((Pb,Ca)(Zr,Ti)O_3)$, $Bi_4Ti_3O_{12}$, BLT, or $BiLaTiO_3$.

13. A ferroelectric capacitor according to claim 2, further comprising an oxidation barrier layer disposed between the protruding portion of the conductive plug and the first conductive layer.

14. A ferroelectric capacitor according to claim 13 wherein the oxidation barrier layer is formed on a top and on the side wall surface of the protruding portion of the conductive plug.

15. A ferroelectric capacitor according to claim 13 further comprising an etch stop layer disposed between the conductive plug and the oxidation barrier layer.

16. A ferroelectric capacitor according to claim 15, wherein the etch stop layer is formed on a top and on the side wall surfaces of the protruding portion of the conductive plug.

17. A non-volatile memory device comprising:
   a substrate;
   a first ferroelectric capacitor, on the substrate, comprising a first conductive plug having a first portion with a first side wall, a second portion on the first portion with a second sidewall on the first portion, and a first conductive layer on the second portion opposite the first portion; and a second ferroelectric capacitor, spaced apart from the first ferroelectric capacitor on the substrate, the second ferroelectric capacitor comprising a second conductive plug having a first portion with a first side wall that is adjacent to and spaced-apart from the first side wall of the first conductive plug by a first distance, a second portion of the second ferroelectric capacitor having a second side wall on the first portion of the second conductive plug that is adjacent to and spaced-apart from the second side wall of the first conductive plug by a second distance that is greater than the first distance, and a second conductive layer spaced-apart from the first conductive layer and on the second portion of the second conductive plug opposite the first portion of the second conductive plug, wherein the first and second respective portions of the first and second conductive plugs comprise respective unitary structures.

18. A non-volatile memory device according to claim 17 wherein an offset between the first and second side walls of the first conductive plug defines a shoulder of the first conductive plug, wherein the first conductive layer is on the shoulder.

19. A non-volatile memory device according to claim 17 wherein the first and second conductive layers are separated by a gap between the first and second conductive plugs, the non-volatile memory device further comprising:

a ferroelectric material on the first and second conductive plugs and in the gap; and a third conductive layer on the ferroelectric material.

20. A non-volatile memory device according to claim 17 wherein the first and second conductive layers respectively are formed on a top and the side wall surfaces of the second portion of the first and second conductive plugs, respectively.

21. A non-volatile memory device according to claim 17 further comprising a first oxidation barrier layer disposed between the second portion of the first conductive plug and the first conductive layer and a second oxidation barrier layer disposed between the second portion of the second conductive plug and the second conductive layer.

22. A non-volatile memory device according to claim 21 wherein the first oxidation barrier layer is formed on a top and on the side wall surface of the second portion of the first conductive plug and the second oxidation barrier layer is formed on a top and on the side wall surfaces of the second portion of the second conductive plug.

23. A non-volatile memory device according to claim 21 further comprising a first etch stop layer disposed between the first conductive plug and the first oxidation barrier layer and a second etch stop layer disposed between the second conductive plug and the second oxidation barrier layer.

24. A non-volatile memory device according to claim 23 wherein the first etch stop layer is formed on a top and on the side wall surfaces of the second portion of the first conductive plug and the second etch stop layer is formed on a top and on the side wall surface of the second portion of the second conductive plug.

* * * * *